(12) United States Patent
Hsu et al.

(10) Patent No.: US 9,564,900 B2
(45) Date of Patent: Feb. 7, 2017

(54) SUPPLY BOOST DEVICE

(71) Applicant: TAIWAN SEMICONDUCTOR MANUFACTURING CO., LTD., Hsinchu (TW)

(72) Inventors: Ying-Yu Hsu, Hsinchu (TW); Chien-Chun Tsai, Jhudong Township (TW); Yu-Nan Shih, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/688,897

(22) Filed: Apr. 16, 2015

(65) Prior Publication Data

US 2016/0308533 A1    Oct. 20, 2016

(51) Int. Cl.
*H03K 19/0175* (2006.01)
*H03K 19/0185* (2006.01)

(52) U.S. Cl.
CPC .............. *H03K 19/018521* (2013.01)

(58) Field of Classification Search
CPC ............... H03K 19/018521; H03K 19/0185
USPC .............. 326/81, 27, 29, 36, 68, 83, 86, 87
See application file for complete search history.

(56) References Cited

U.S. PATENT DOCUMENTS

| 6,489,809 B2 * | 12/2002 | Kiehl | H03K 19/00361 326/27 |
|---|---|---|---|
| 7,956,586 B2 | 6/2011 | Nagai et al. | |
| 9,024,558 B2 | 5/2015 | Sugie | |
| 2007/0002954 A1 | 1/2007 | Cornelius et al. | |
| 2014/0055163 A1 | 2/2014 | Song | |
| 2015/0061745 A1 | 3/2015 | Shih | |

FOREIGN PATENT DOCUMENTS

| CN | 103560669 A | 2/2014 |
|---|---|---|
| JP | 2013-247584 A | 12/2013 |

* cited by examiner

*Primary Examiner* — Daniel D Chang
(74) *Attorney, Agent, or Firm* — Maschoff Brennan

(57) ABSTRACT

A device is disclosed that includes a driver circuit and a control circuit. The driver circuit is configured to provide an output signal according to an input signal, and operated with a first voltage and a second voltage. The driver circuit includes a pull up unit and a pull down unit configured to pull up and pull down a voltage level of the output signal, respectively. The control circuit is configured to selectively enable one of the pull up unit and the pull down unit according to the input signal, so as to adjust the voltage level of the output signal. The control circuit is further configured to drive the enabled one of the pull up unit and the pull down unit in a voltage mode or a current mode selectively according to the voltage level of the output signal, the first voltage and the second voltage.

21 Claims, 7 Drawing Sheets

SUPPLY BOOST DEVICE

BACKGROUND

In advance technology, applications of various tolerant voltages are required to be integrated and compatible in a product. In related approaches, a supply boost is designed and configured to output various driving voltages for the aforementioned applications. For achieving signal integrity, impedance control and accurate slew rate adjustment associated with the supply boost are considered. However, high precision linearity requirement for impedance control over wide voltage range and accurate slew rate adjustment cannot be performed within typical supply boosts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
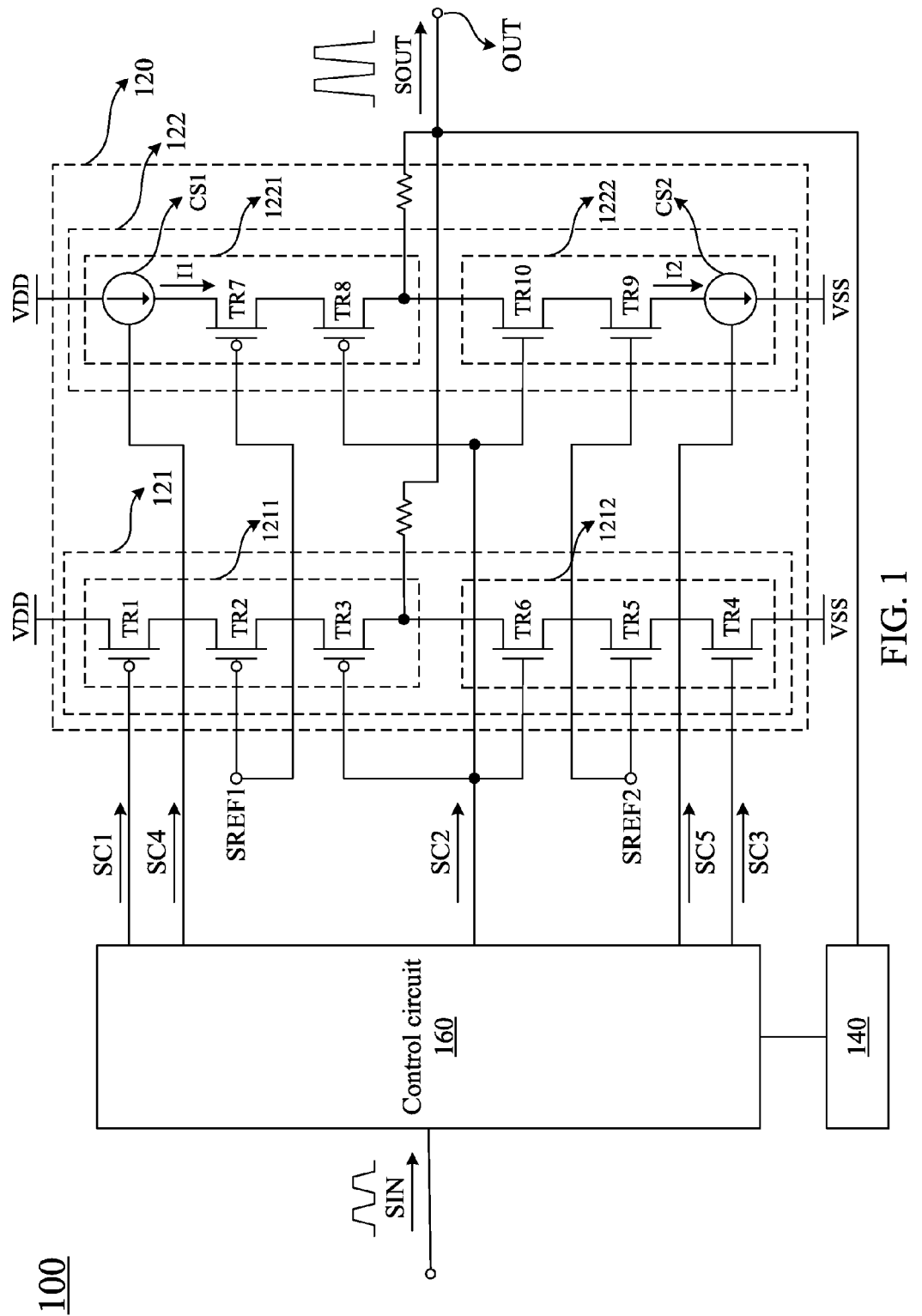
FIG. 1 is a schematic diagram of a supply boost device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

FIG. 1 is a schematic diagram of a supply boost device 100 in accordance with various embodiments of the present disclosure. The supply boost device 100 is configured to provide an output signal SOUT via an output terminal OUT, e.g., a pad, in accordance with an input signal SIN. In some embodiments, the supply boost device 100 is configured to boost a voltage level of the input signal SIN and output the boosted input signal (i.e., the output signal SOUT) as a supply voltage. In further embodiments, the supply boost device 100 outputs the output signal SOUT which has a triple of the input signal SIN. For illustration, the output signal SOUT and the input signal SIN both at a logic low level have a same voltage level, and a voltage level of the output signal SOUT at a logic high level has the triple of a voltage level of the input signal SIN at a logic high level.

As illustratively shown in FIG. 1, the supply boost device 100 includes a driver circuit 120, a voltage level detection circuit 140 and a control circuit 160. The driver circuit 120 is configured to adjust a voltage level of the output signal SOUT, and output the output signal SOUT at the output terminal OUT. The voltage level detection circuit 140 is electrically coupled to the output terminal OUT, and configured to detect a voltage level of the output signal SOUT. The control circuit 160 is electrically coupled to the driver circuit 120 and the voltage level detection circuit 140. The control circuit 160 is configured to control the driver circuit 120 in accordance with the input signal SIN and the output of the voltage level detection circuit 140.

In some embodiments, the driver circuit 120 includes a voltage mode driver 121 and a current mode driver 122. The voltage mode driver 121 is configured to adjust a voltage level of the output signal SOUT in a voltage mode. The current mode driver 122 is configured to adjust the voltage level of the output signal SOUT in a current mode. The control circuit 160 controls one of the voltage mode driver 121 and the current mode driver 122 selectively to adjust the voltage level of the output signal SOUT.

In some embodiments, the voltage mode driver 121 includes a first pull up unit 1211 and a first pull down unit 1212. The first pull up unit 1211 and the first pull down unit 1212 are configured to pull up and pull down the voltage level of the output signal SOUT, respectively, in the voltage mode. The current mode driver 122 includes a second pull up unit 1221 and a second pull down unit 1222. The second pull up unit 1221 and the second pull down unit 1222 are configured to pull up and pull down the voltage level of the output signal SOUT, respectively, in the current mode.

Moreover, the control circuit 160 is configured to generate control signals SC1-SC5 for enabling one of the first pull up unit 1211, the first pull down unit 1212, the second pull up unit 1221 and the second pull down unit 1222, so as to adjust a voltage level of the output signal SOUT in the voltage mode or the current mode selectively.

In some embodiments, as illustratively shown in FIG. 1, the first pull up unit 1211 includes transistors TR1-TR3. A first terminal of the transistor TR1 is configured to receive a voltage VDD, a second terminal of the transistor TR1 is electrically coupled to a first terminal of the transistor TR2, and a control terminal of the transistor TR1 is configured to receive the control signal SC1. A second terminal of the transistor TR2 is electrically coupled to a first terminal of the transistor TR3, and a control terminal of the transistor TR2 is configured to receive a reference signal SREF1. A second terminal of the transistor TR3 is electrically coupled to the output terminal OUT, and a control terminal of the transistor TR3 is configured to receive the control signal SC2.

In some embodiments, the first pull down unit 1212 includes transistors TR4-TR6. A first terminal of the transistor TR4 is configured to receive a voltage VSS, a second terminal of the transistor TR4 is electrically coupled to a first terminal of the transistor TR5, and a control terminal of the transistor TR4 is configured to receive the control signal SC3. A second terminal of the transistor TR5 is electrically coupled to a first terminal of the transistor TR6, and a control terminal of the transistor TR5 is configured to receive a reference signal SREF2. A second terminal of the transistor TR6 is electrically coupled to the second terminal of the transistor TR3 and the output terminal OUT, and a control terminal of the transistor TR6 is configured to receive the control signal SC2.

In some embodiments, the second pull up unit 1221 includes a current source CS1 and transistors TR7-TR8. The current source CS1 is configured to provide a first current I1 in accordance with the control signal SC4. A first terminal of the transistor TR7 is configured to receive the first current I1, a second terminal of the transistor TR7 is electrically coupled to a first terminal of the transistor TR8, and a control terminal of the transistor TR7 is configured to receive the reference signal SREF1. A second terminal of the transistor TR8 is electrically coupled to the output terminal OUT, and a control terminal of the transistor TR8 is configured to receive the control signal SC2.

In some embodiments, the second pull down unit 1222 includes a current source CS2 and transistors TR9-TR10. The current source CS2 is configured to provide a second current I2 in accordance with the control signal SC5. A first terminal of the transistor TR9 is configured to receive the second current I2, a second terminal of the transistor TR9 is electrically coupled to a first terminal of the transistor TR10, and a control terminal of the transistor TR9 is configured to receive the reference signal SREF2. A second terminal of the transistor TR10 is electrically coupled to the second terminal of the transistor TR8 and the output terminal OUT, and a control terminal of the transistor TR10 is configured to receive the control signal SC2.

For simplicity, one first pull up unit 1211 and one first pull down unit 1212 are illustrated in FIG. 1, but they are given for illustrative purposes. Various numbers and configurations of the first pull up unit 1211 and the first pull down unit 1212 are within the contemplated scope of the present disclosure. Alternatively stated, in various embodiments, the voltage mode driver 121 includes several first pull up units 1211 connected in parallel and several first pull down units 1212 connected in parallel.

Furthermore, for simplicity, one second pull up unit 1221 and one second pull down unit 1222 are illustrated in FIG. 1, but they are given for illustrative purposes. Various numbers and configurations of the second pull up unit 1221 and the second pull down unit 1222 are within the contemplated scope of the present disclosure. Alternatively stated, in various embodiments, current mode driver 122 includes several second pull up unit 1221 connected in parallel and several second pull down unit 1222 connected in parallel.

Figure 2:
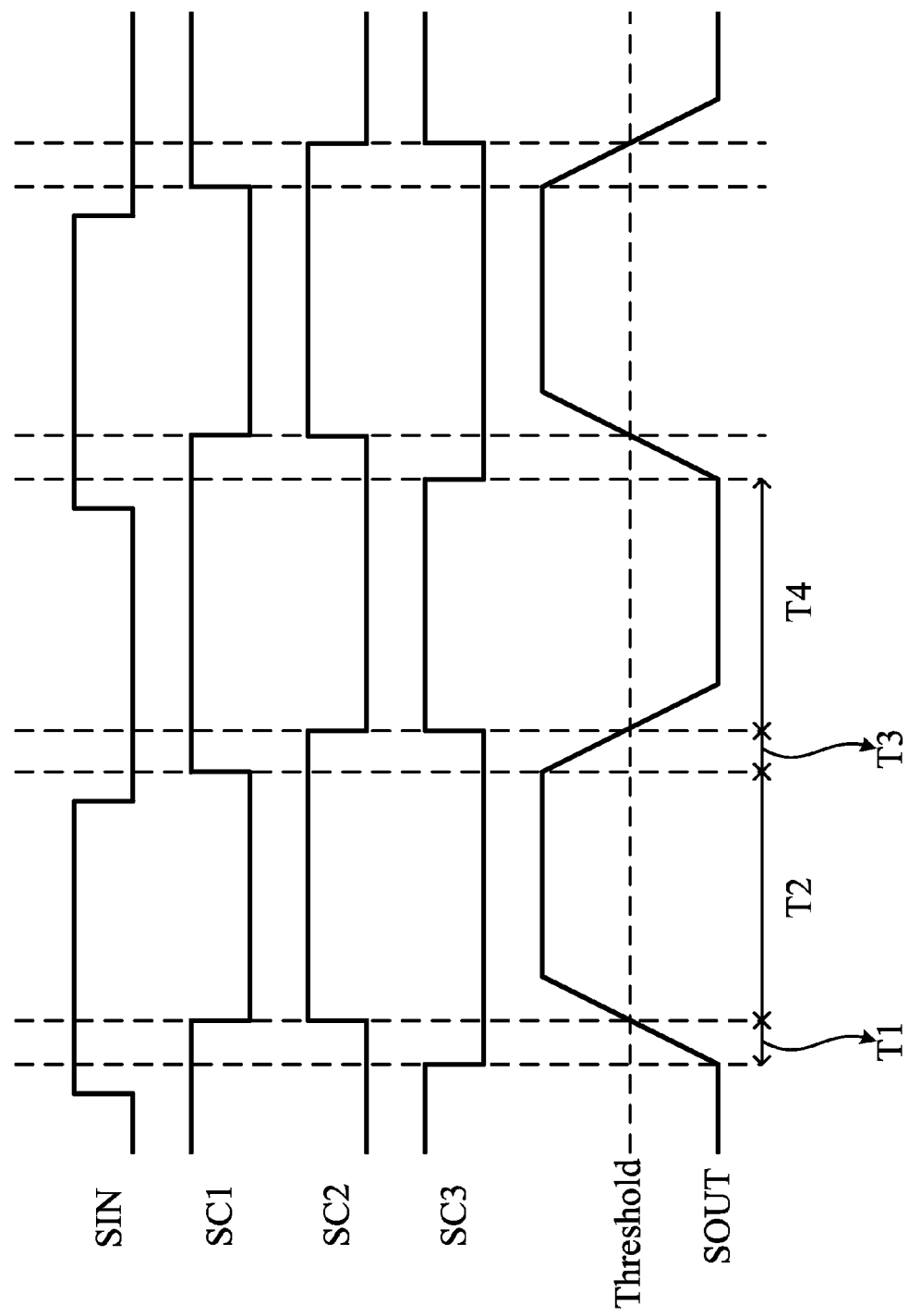
FIG. 2 is a waveform illustrating the input signal, the output signal and the control signals in accordance with various embodiments of the present disclosure.

FIG. 2 is a schematic diagram illustrating waveforms of the input signal SIN, the output signal SOUT and the control signals SC1-SC3 in accordance with various embodiments of the present disclosure. The voltage levels and relations of the input signal SIN, the output signal SOUT and the control signals SC1-SC3 in FIG. 2 are given for illustration below.

Hereinafter, for simplicity, "1X" is indicative of a voltage level of the input signal at a logic high level, "2X" is indicative of the double of a voltage level of the input signal at a logic high level, "3X" is indicative of the triple of a voltage level of the input signal at a logic high level, and so on. For illustration in FIG. 1 and FIG. 2, in a condition that the supply boost device 100 provides the output signal SOUT which has a triple of the input signal SIN, a voltage level of the input signal SIN from low to high is from 0 to 1X Volts and a voltage level of the output signal SOUT from low to high is from 0 to 3X Volts. Moreover, a voltage level of the control signal SC1 from low to high is from 2X to 3X Volts. A voltage level of the control signal SC2 from low to high is from 1X to 2X Volts. A voltage level of the control signal SC3 from low to high is from 0X to 1X Volts. Furthermore, a voltage level of the voltage VDD is configured as 3X Volts, and a voltage level of the voltage VSS is configured as 0 Volts. A voltage level of the reference signal SREF1 is configured as 2X Volts, and a voltage level of the reference signal SREF2 is configured as 1X Volts. Voltage levels and transitions of the aforementioned signals are given for illustration. Various voltage levels and transitions of the aforementioned signals are within the contemplated scope of the present disclosure.

Figure 3:
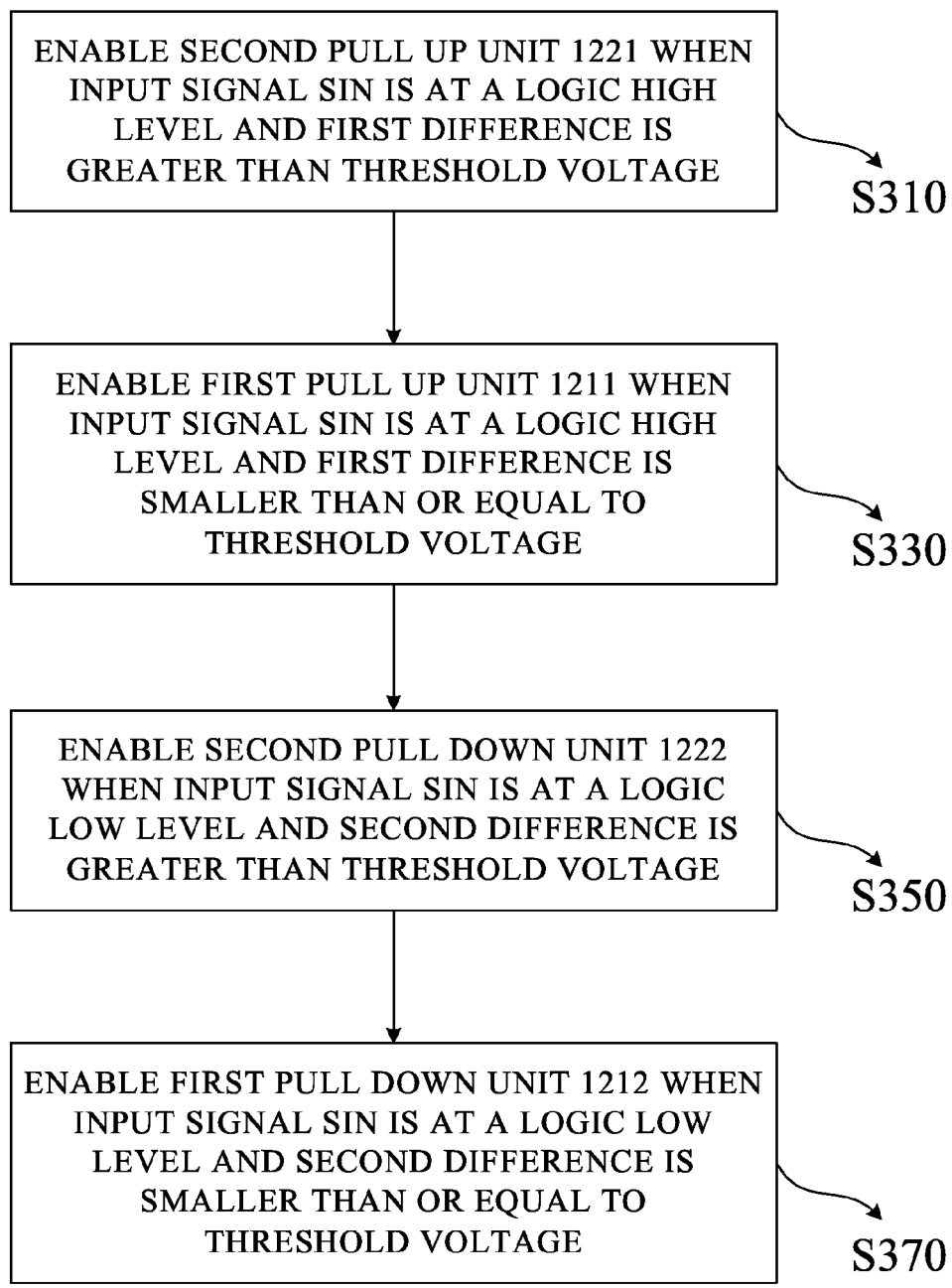
FIG. 3 is a flow chart of a method illustrating operations of the driver circuit in FIG. 1 in accordance with various embodiments of the present disclosure.

FIG. 3 is a flow chart of a method illustrating operations of the driver circuit 120 in FIG. 1 in accordance with some embodiments of the present disclosure. The operations of the driver circuit 120 in FIG. 1 are described below by the method illustrated in FIG. 3, with reference to the waveforms illustrated in FIG. 2.

As illustratively shown in FIG. 3, in operation S310, the second pull up unit 1221 is enabled when the input signal SIN is at a logic high level and a first difference between a voltage level of the output signal SOUT and the voltage VDD is greater than a threshold voltage. In other words, the second pull up unit 1221 is enabled within a period T1 as shown in FIG. 2. In some embodiments, the threshold voltage is approximately half of a desired supply voltage supplied by the supply boost device 100. For example, the threshold voltage is approximately 1.5X Volts, but it is given for illustrative purposes and not limiting of the present disclosure.

Specifically, the input signal SIN is at a logic high level, representing that the output signal SOUT is pulled up to a logic high level. Therefore, the first pull up unit 1211 or the second pull up unit 1221 is enabled to pull up the output signal SOUT when the input signal SIN is at a logic high level. Moreover, when the output signal SOUT begins to be pulled up (i.e., at beginning of the period T1), the voltage level of the output signal SOUT is low (e.g., 0 Volts). In other words, a difference between the voltage level of the output signal SOUT and the voltage VDD tends to be high at first (i.e., the first difference is greater than the threshold voltage). Accordingly, the control circuit 160 enables the pull up unit of the driver circuit 120 in the current mode, in other words, the control circuit 160 enables the second pull up unit 1221.

In some embodiments, as illustratively shown in FIG. 2, within the period T1, the control circuit 160 outputs the control signal SC1 at a logic high level (e.g., 3X Volts). Therefore, the transistor TR1 is switched off, such that the first pull up unit 1211 is disabled. Moreover, the control circuit 160 outputs the control signal SC3 at a logic low level (e.g., 0 Volts). Therefore, the transistor TR4 is switched off, such that the first pull down unit 1212 is disabled.

Furthermore, within the period T1, the control circuit 160 generates the control signals SC4 and SC5 to switch on the current source CS1 and switch off the current source CS2, respectively. Accordingly, the second pull up unit 1221 is enabled with the first current I1 and the second pull down unit 1222 is disabled. Accordingly, the control circuit 160 controls the driver circuit 120 to operate in the current mode. As a result, the output signal SOUT is pulled up when the input signal SIN is at a logic high level and the first difference is greater than the threshold voltage within the period T1.

In operation S330, the first pull up unit 1211 is enabled when the input signal SIN is at a logic high level and the first difference is smaller than or equal to the threshold voltage. In other words, the first pull up unit 1211 is enabled within a period T2 as shown in FIG. 2.

When the input signal SIN is at a logic high level, the first pull up unit 1211 or the second pull up unit 1221 is enabled to pull up the output signal SOUT. Moreover, when the voltage level of the output signal SOUT is pulled up higher than the threshold voltage (i.e., at beginning of the period T2), a difference between the voltage level of the output signal SOUT and the voltage VDD tends to be low. Therefore, the control circuit 160 enables the pull up unit of the driver circuit 120 in the voltage mode, in other words, the control circuit 160 enables the first pull up unit 1211.

In some embodiments, as illustratively shown in FIG. 2, within the period T2, the control circuit 160 outputs the control signal SC1 at a logic low level (e.g., 2X Volts). Therefore, the transistor TR1 is switched on, such that the first pull up unit 1211 is enabled. Similarly, the control circuit 160 outputs the control signal SC3 at a logic low level (e.g., 0 Volts), such that the first pull down unit 1212 is disabled.

Furthermore, within the period T2, the control circuit 160 generates the control signals SC4 and SC5 both to switch off the current source CS1 and CS2. Accordingly, the second pull up unit 1221 and the second pull down unit 1222 both are disabled. Accordingly, the control circuit 160 controls the driver circuit 120 to operate in the voltage mode. As a result, the output signal SOUT is pulled up when the input signal SIN is at a logic high level and the first difference is smaller than or equal to the threshold voltage within the period T2.

In operation S350, the second pull down unit 1222 is enabled when the input signal SIN is at a logic low level and a second difference between a voltage level of the output signal SOUT and the voltage VSS is greater than the threshold voltage. In other words, the second pull down unit 1222 is enabled within a period T3 as shown in FIG. 2.

Specifically, the input signal SIN is at a logic low level, representing that the output signal SOUT is pulled down to a logic low level. Therefore, the first pull down unit 1212 or the second pull down unit 1222 is enabled to pull down the output signal SOUT when the input signal SIN is at a logic low level. Moreover, when the output signal SOUT begins to be pulled down (i.e., at beginning of the period T3), the voltage level of the output signal SOUT is high (e.g., 3X Volts). In other words, a difference between the voltage level of the output signal SOUT and the voltage VSS tends to be high at first (i.e., the second difference is greater than the threshold voltage). Accordingly, the control circuit 160 enables the pull down unit of the driver circuit 120 in the current mode, in other words, the control circuit 160 enables the second pull down unit 1222.

In some embodiments, as illustratively shown in FIG. 2, within the period T3, the control circuit 160 outputs the control signal SC1 at a logic high level (e.g., 3X Volts) and the control signal SC3 at a logic low level (e.g., 0 Volts). Therefore, the first pull up unit 1211 and the first pull down unit 1212 are both disabled. Moreover, the control circuit 160 generates the control signals SC4 and SC5 to switch off the current source CS1 and switch on the current source CS2, respectively. Accordingly, the second pull up unit 1221 is disabled and the second pull down unit 1222 is enabled by the second current I2. Accordingly, the control circuit 160 controls the driver circuit 120 to operate in the current mode. As a result, the output signal SOUT is pulled down when the input signal SIN is at a logic low level and the second difference is greater than the threshold voltage within the period T3.

In operation S370, the first pull down unit 1212 is enabled when the input signal SIN is at a logic low level and the second difference is smaller than or equal to the threshold voltage. In other words, the first pull down unit 1212 is enabled within a period T4 as shown in FIG. 2.

When the input signal SIN is at a logic low level, the first pull down unit 1212 or the second pull down unit 1222 is enabled to pull down the output signal SOUT. Moreover, when the voltage level of the output signal SOUT is pulled down lower than the threshold voltage (i.e., at beginning of the period T4), a difference between the voltage level of the output signal SOUT and the voltage VSS tends to be low. Therefore, the control circuit 160 enables the pull down unit of the driver circuit 120 in the voltage mode, in other words, the control circuit 160 enables the first pull down unit 1212.

In some embodiments, as illustratively shown in FIG. 2, within the period T4, the control circuit 160 outputs the control signal SC3 at a logic high level (e.g., 1X Volts). Therefore, the transistor TR4 is switched on, such that the first pull down unit 1212 is enabled. Similarly, the control circuit 160 outputs the control signal SC1 at a logic high level (e.g., 3X Volts), such that the first pull up unit 1211 is disabled.

Furthermore, within the period T4, the control circuit 160 generates the control signals SC4 and SC5 both to switch off the current source CS1 and CS2. Accordingly, the second pull up unit 1221 and the second pull down unit 1222 both are disabled. Accordingly, the control circuit 160 controls the driver circuit 120 to operate in the voltage mode. As a result, the output signal SOUT is pulled down when the input signal SIN is at a logic low level and the second difference is smaller than or equal to the threshold voltage within the period T4.

In accordance with the aforementioned embodiments, the driver circuit 120 is operated in the current mode when a difference between the voltage level of the output signal SOUT and the voltages VDD (or VSS) is greater than the threshold voltage. As a result, SSO noise and HCI risk are reduced when the driver circuit 120 adjusts the output signal SOUT with large currents. Moreover, slew rate of the output signal SOUT is controlled effectively. Furthermore, the driver circuit 120 is operated in the voltage mode when a difference between the voltage level of the output signal SOUT and the voltages VDD (or VSS) is smaller than or equal to the threshold voltage. As a result, the driver circuit 120 has good impedance linearity property in this operation region. Since currents flowing through the driver circuit 120 in this operation region are small, the effect of SSO noise and HCI risk is reduced. Effectively, with the voltage mode driver 121 and the current mode driver 122 configured in the driver circuit 120, robust impedance control over a wide voltage range and accurate slew rate adjustment both are realized.

In some embodiments, the current sources CS1 and CS2 in FIG. 1 are current mirrors configured to provide the respect first current I1 and second current I2 in accordance with a reference current. Therefore, values of the first current I1 and the second current I2 is adjusted by adjusting the reference current. Value of the reference current depends on a voltage level of the desired supply voltage supplied by the supply boost device 100.

In some embodiments, the current sources CS1 and CS2 in FIG. 1 are replaced with self-bias current sources. The self-bias current source also provides a constant current. For illustration, in a condition that a gate terminal and a drain terminal of an N-type MOS transistor are connected and the N-type MOS transistor is operated in a saturation region, the N-type MOS provides an approximately constant current once a constant voltage is provided at the gate terminal of the N-type MOS. Therefore, the current mode driver with the self-bias current source has the same property as that with the constant current source (e.g., current mirror).

Figure 4:
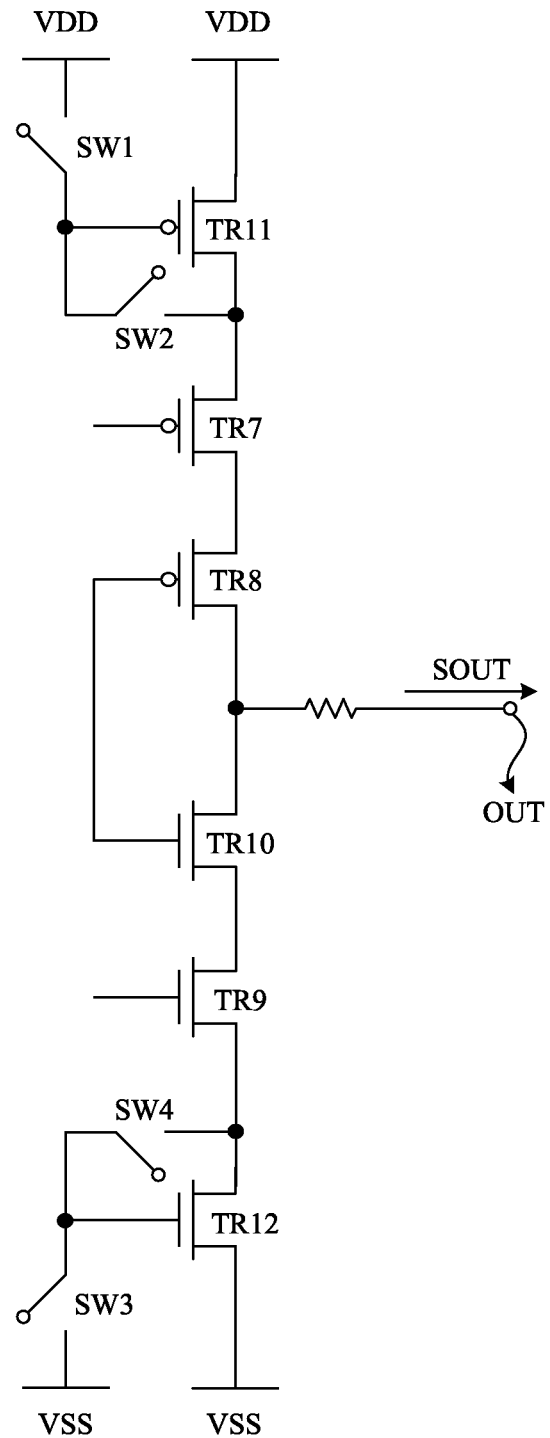
FIG. 4 is a schematic diagram of a current mode driver in accordance with various embodiments of the present disclosure.

Reference is made to FIG. 4. FIG. 4 is a schematic diagram of a current mode driver 400 in accordance with various embodiments of the present disclosure. In some embodiments, the current mode driver 400 is applied in the supply boost device 100 in FIG. 1, but the present disclosure is not limited in this regard.

As illustratively shown in FIG. 4, the current mode driver 400 includes transistors TR11 and TR12 substituted for the respect current source CS1 and CS2 as shown in FIG. 1. A first terminal of the transistor TR11 is configured to receive the voltage VDD, and a second terminal of the transistor TR11 is electrically coupled to the first terminal of the transistor TR7. A control terminal of the transistor TR11 is configured to receiver the voltage VDD selectively through a switch SW1, and is electrically coupled to the second terminal of the transistor TR11 through a switch SW2. A first terminal of the transistor TR12 is configured to receive the voltage VSS, and a second terminal of the transistor TR12 is electrically coupled to the first terminal of the transistor TR9. A control terminal of the transistor TR12 is configured to receive the voltage VSS selectively through a switch SW3, and is electrically coupled to the second terminal of the transistor TR12 through a switch SW4.

In some embodiments, the switches SW2 and SW3 are controlled to be switched on and the switches SW1 and SW4 are controlled to be switched off. Therefore, the transistor TR11 is switched on in a self-biased form and the transistor TR12 is switched off by the voltage VSS. Accordingly, the current mode driver 400 is operated to pull up a voltage level of the output signal SOUT in the current mode. In some other embodiments, the switches SW1 and SW4 are controlled to be switched on and the switches SW2 and SW3 to be switched off. Therefore, the transistor TR12 is switched on in a self-biased from and the transistor TR11 is switched off by the voltage VDD. Accordingly, the current mode driver 400 is operated to pull down a voltage level of the output signal SOUT in the current mode.

For simplicity, one channel (one pull up unit and one pull down unit) for adjusting a voltage level of the output signal SOUT in the current mode driver 400 is illustrated, but various numbers of channels in the current mode driver 400 are within the contemplated scope of the present disclosure. As a result, the control circuit is able to adjust value of current by adjusting the number of switched-on channels.

The current mode driver with the self-bias current source has the same property as that with the constant current source (e.g., current mirror). In other words, the self-bias current mode driver also has good slew rate control, low SSO noise and HCI risk. Moreover, compared with the current mode driver in other approaches, the self-bias current mode driver employs the transistor rather than the current mirror. Therefore, the self-bias current mode driver has lower cost than that of the constant current mode driver.

Figure 5:
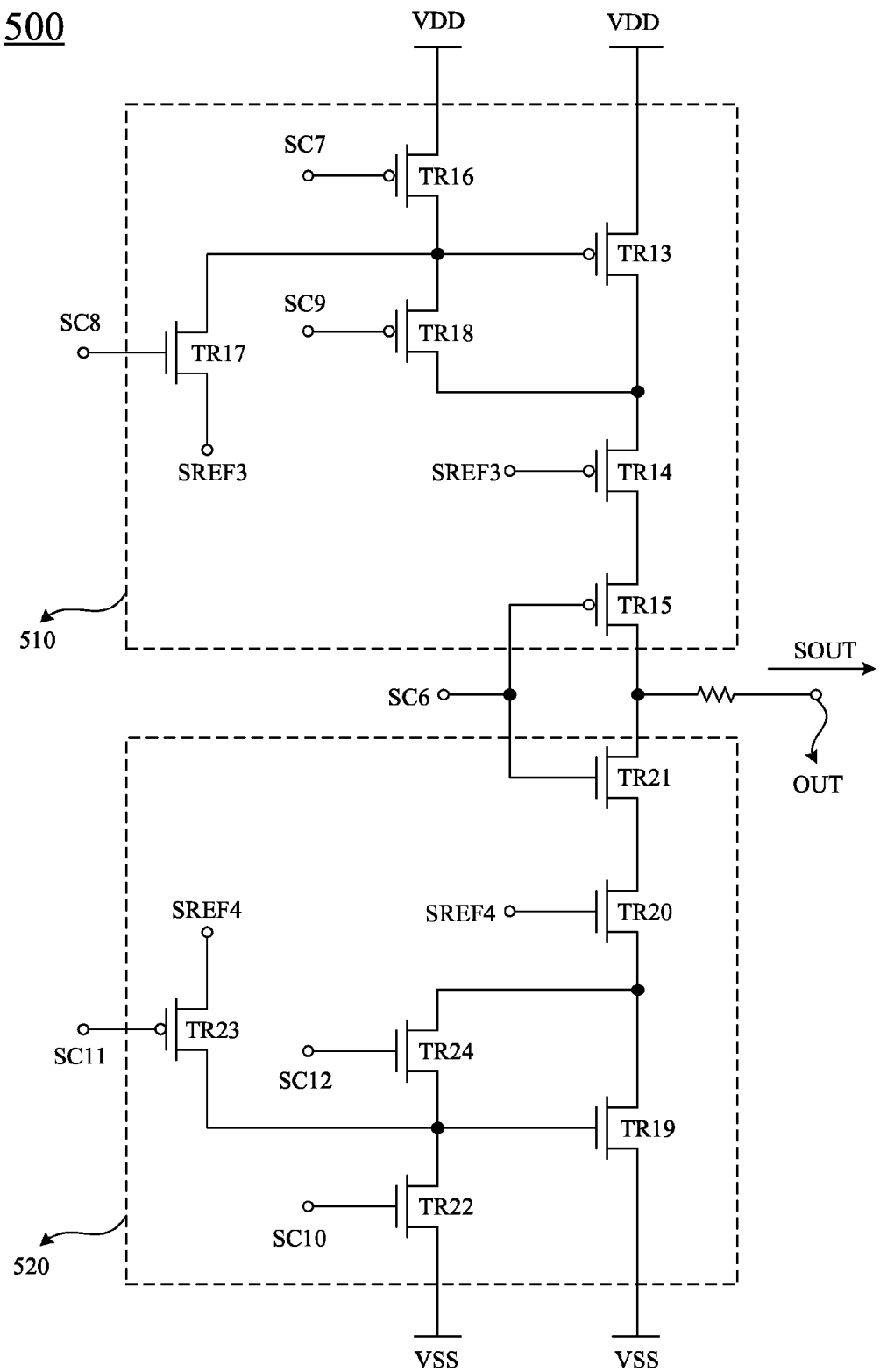
FIG. 5 is a schematic diagram of a driver circuit in accordance with various embodiments of the present disclosure.

Reference is made to FIG. 5. FIG. 5 is a schematic diagram of a driver circuit 500 in accordance with various embodiments of the present disclosure. In some embodiments, the driver circuit 500 is applied in the supply boost device 100 in FIG. 1, but the present disclosure is not limited in this regard. As illustrative shown in FIG. 5, the driver circuit 500 includes a pull up unit 510 and a pull down unit 520. The pull up unit 510 is configured to pull up a voltage level of the output signal SOUT. The pull down unit 520 is configured to pull down the voltage level of the output signal SOUT.

In some embodiments, the pull up unit 510 includes transistors TR13-TR18. A first terminal of the transistor TR13 is configured to receive a voltage VDD, and a second terminal of the transistor TR13 is electrically coupled to a first terminal of the transistor TR14. A second terminal of the transistor TR14 is electrically coupled to a first terminal of the transistor TR15, and a control terminal of the transistor TR14 is configured to receive a reference signal SREF3. A second terminal of the transistor TR15 is electrically coupled to the output terminal OUT, and a control terminal of the transistor TR15 is configured to receive a control signal SC6.

A first terminal of the transistor TR16 is configured to receive the voltage VDD, a second terminal of the transistor TR16 is electrically coupled to a control terminal of the transistor TR13, and a control terminal of the transistor TR16 is configured to receive a control signal SC7 corresponding to the input signal SIN. A first terminal of the transistor TR17 is electrically coupled to the control terminal of the transistor TR13, a second terminal of the transistor TR17 is configured to receive the reference signal SREF3, and a control terminal of the transistor TR17 is configured to receive a control signal SC8. A first terminal of the transistor TR18 is electrically coupled to the control terminal of the transistor TR13, a second terminal of the transistor TR18 is electrically coupled to the second terminal of the transistor TR13, and a control terminal of the transistor TR18 is configured to receive a control signal SC9.

In some embodiments, the pull down unit 520 includes transistors TR19-TR24. A first terminal of the transistor TR19 is configured to receive a voltage VSS, and a second terminal of the transistor TR19 is electrically coupled to a first terminal of the transistor TR20. A second terminal of the transistor TR20 is electrically coupled to a first terminal of the transistor TR21, and a control terminal of the transistor TR20 is configured to receive a reference signal SREF4. A second terminal of the transistor TR21 is electrically coupled to the output terminal OUT, and a control terminal of the transistor TR21 is configured to receive the control signal SC6.

A first terminal of the transistor TR22 is configured to receive the voltage VSS, a second terminal of the transistor TR22 is electrically coupled to a control terminal of the transistor TR19, and a control terminal of the transistor TR22 is configured to receive a control signal SC10 corresponding to the input signal SIN. A first terminal of the transistor TR23 is electrically coupled to the control terminal of the transistor TR19, a second terminal of the transistor TR23 is configured to receive the reference signal SREF4, and a control terminal of the transistor TR23 is configured to receive a control signal SC11. A first terminal of the transistor TR24 is electrically coupled to the control terminal of the transistor TR19, a second terminal of the transistor TR24 is electrically coupled to the second terminal of the transistor TR19, and a control terminal of the transistor TR24 is configured to receive a control signal SC12.

In the present embodiment, the voltage mode driver and the current mode driver of the driver circuit 500 share the same configurations. For illustration, the voltage mode driver and the current mode driver of the driver circuit 500 shares the transistors TR13-TR15 for pulling up a voltage level of the output signal SOUT, and shares the transistors TR19-TR21 for pulling down the voltage level of the output signal SOUT.

In some embodiments, the aforementioned control signals SC6-SC12 are generated by a control circuit (not shown in the figure) similar to the control circuit 160 in FIG. 1. In some embodiments, the driver circuit 500 is configured to output the output signal SOUT which has a triple of the input signal SIN. Therefore, the pull up unit 510 includes three transistors TR13-TR15 for pulling up the voltage level of the output signal SOUT, and the pull down unit 520 includes three transistors TR19-TR21 for pulling down the voltage level of the output signal SOUT. However, various numbers of transistors in the pull up unit 510 and the pull down unit 520 are within the contemplated scope of the present disclosure.

Figure 6:
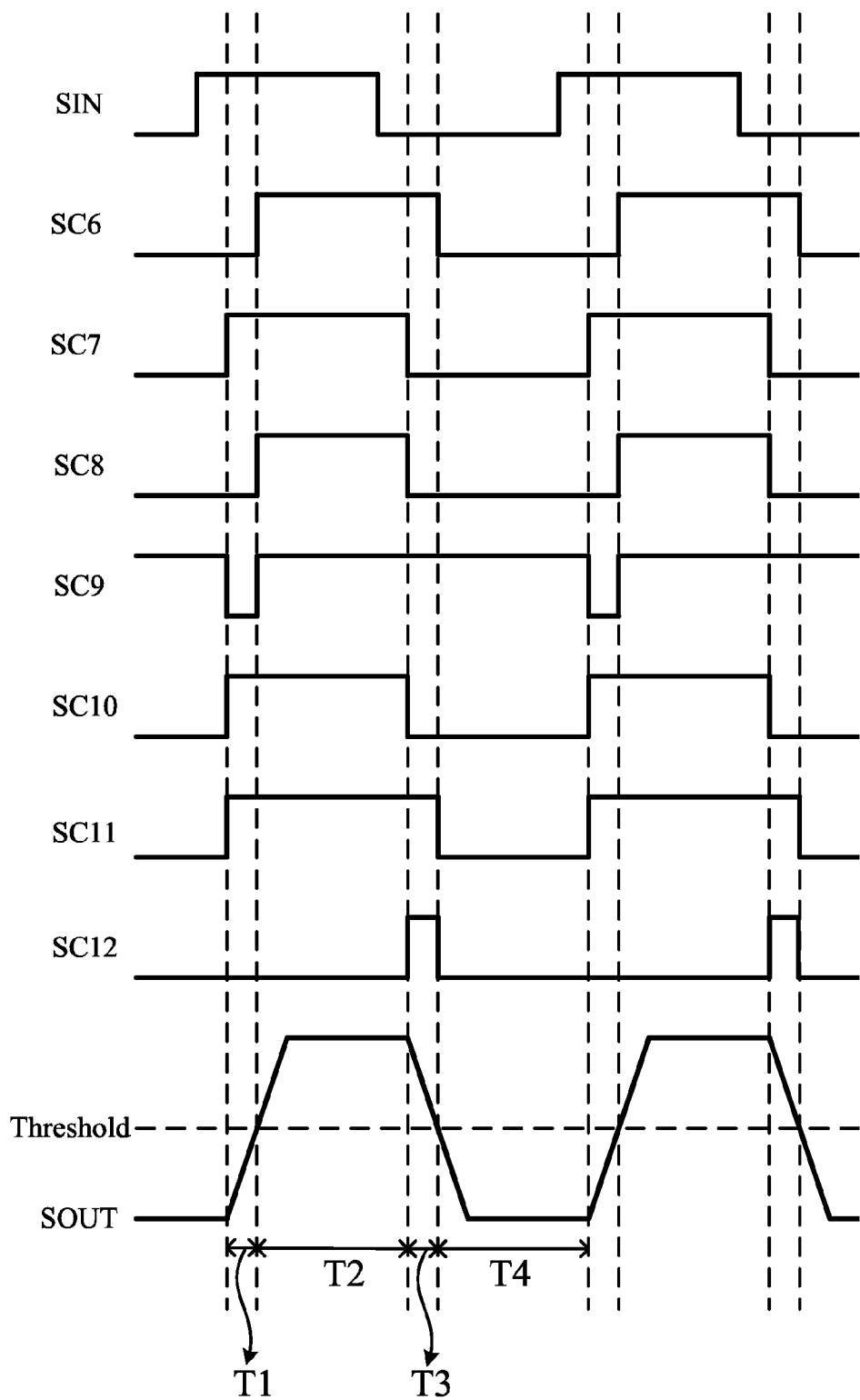
FIG. 6 is a waveform illustrating the input signal, the output signal and the control signals in accordance with various embodiments of the present disclosure.

FIG. 6 is a schematic diagram illustrating waveforms of the input signal SIN, the output signal SOUT and the control signals SC6-SC12 in accordance with various embodiments of the present disclosure. The voltage levels and relations of the input signal SIN, the output signal SOUT and the control signals SC1-SC3 in FIG. 2 are given for illustration below.

For illustration in FIG. 5 and FIG. 6, in a condition that the supply boost device 100 provides the output signal SOUT which has a triple of the input signal SIN, a voltage level of the input signal SIN from low to high is from 0 to 1X Volts and a voltage level of the output signal SOUT from low to high is from 0 to 3X Volts. Moreover, a voltage level of the control signal SC6 from low to high is from 1X to 2X Volts. A voltage level of the control signal SC7 from low to high is from 2X to 3X Volts. A voltage level of the control signal SC8 from low to high is from 2X to 3X Volts. A voltage level of the control signal SC9 from low to high is from 2X to 3X Volts. A voltage level of the control signal SC10 from low to high is from 0 to 1X Volts. A voltage level of the control signal SC11 from low to high is from 0 to 1X Volts. A voltage level of the control signal SC12 from low to high is from 0 to 1X Volts. Furthermore, a voltage level of the voltage VDD is configured as 3X Volts and a voltage level of the voltage VSS is configured as 0 Volts. A voltage level of the reference signal SREF3 is configured as 2X Volts and a voltage level of the reference signal SREF4 is configured as 1X Volts. Voltage levels and transitions of the aforementioned signals are given for illustration. Various voltage levels and transitions of the aforementioned signals are within the contemplated scope of the present disclosure.

Figure 7:
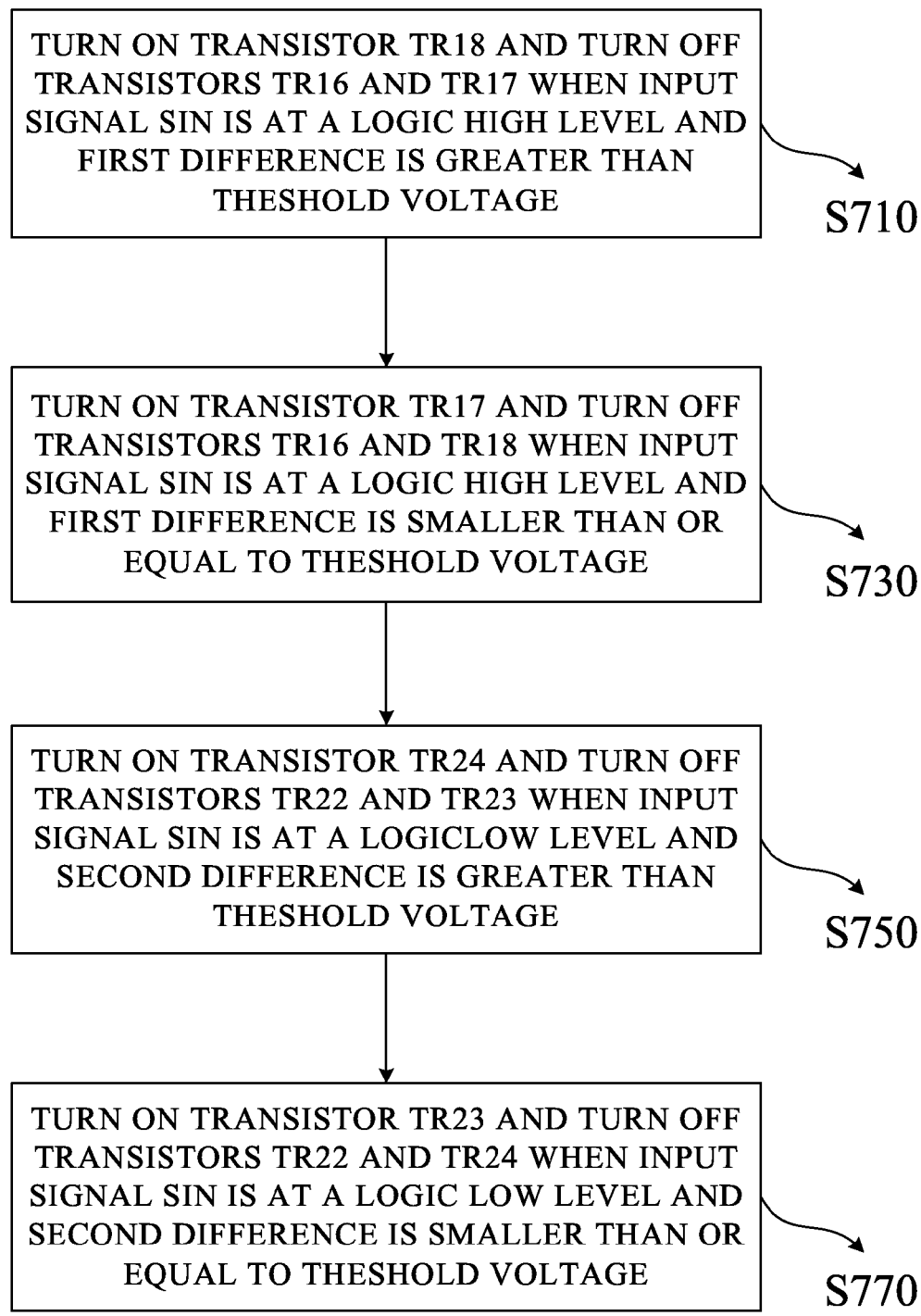
FIG. 7 is a flow chart of a method illustrating operations of the driver circuit in FIG. 5 in accordance with some embodiments of the present disclosure.

FIG. 7 is a flow chart of a method illustrating operations of the driver circuit 500 in FIG. 5 in accordance with some embodiments of the present disclosure. The operations of the driver circuit 500 in FIG. 5 are described below by the method illustrated in FIG. 7, with reference to the waveforms illustrated in FIG. 6.

As illustratively shown in FIG. 7, in operation S710, the transistor TR18 is switched on and the transistors TR16 and TR17 are switched off when the input signal SIN is at a logic high level and a first difference between a voltage level of the output signal SOUT and the voltage VDD is greater than a threshold voltage. Therefore, the transistor TR13 is switched on and operated in a self-bias form. In other words, the pull up unit 510 is enabled in the current mode within a period T1 as shown in FIG. 6.

Moreover, within the period T1, the transistor TR22 is switched on, such that the transistor TR19 is switched off by the voltage VSS, i.e., the pull down unit 520 is disabled. Therefore, the driver circuit 500 is operated to pull up a voltage level of the output signal SOUT in the current mode within the period T1.

In some embodiments, the threshold voltage is approximately half of a desired supply voltage supplied by the supply boost device 100. For example, the threshold voltage is approximately 1.5X Volts, but it is given for illustrative purposes and not limiting of the present disclosure.

As illustratively shown in FIG. 6, specifically, the control circuit (not shown in the figure) generates the control signals SC7 and SC10 by shifting a voltage level of the input signal SIN. Thus, when the input signal SIN is at a logic high level, the transistor TR16 is switched off by the control signal SC7 (at a logic high level, e.g., 3X Volts). Accordingly, the transistor TR13 is switched on, i.e., the pull up unit 510 is enabled. Simultaneously, the transistor TR22 is switched on by the control signal SC10 (at a logic high level, e.g., 1X Volts). Accordingly, the transistor TR19 is switched off by the voltage VSS, i.e., the pull down unit 520 is disabled.

Furthermore, within the period T1, the control circuit (not shown in the figure) outputs the control signals SC8 and SC9 at a logic low level. Therefore, the transistor TR18 is switched on and the transistor 17 is switched off (in the present embodiment, the transistor TR18 is an P-type MOS transistor and the transistor TR17 is an N-type MOS transistor). Accordingly, the control terminal and the second terminal of the transistor TR13 are connected. As a result, the transistor TR13 is operated in a self-bias form. Accordingly, the driver circuit 500 is operated to pull up a voltage level of the output signal SOUT in the current mode when the input signal SIN is at a logic high level and the first difference between a voltage level of the output signal SOUT and the voltage VDD is greater than the threshold voltage.

It is noted that the voltage level of the output signal SOUT is low within the period T1. In order to prevent cross voltage of each of the transistors TR13-TR15 from overstress (e.g., exceeding 1X Volts), the control circuit (not shown in the figure) is configured to generate the control signal SC6 at a logic low level (e.g., 1X Volts).

In operation S730, the transistor TR17 is switched on and the transistors TR16 and TR18 are switched off when the input signal SIN is at a logic high level and the first difference is smaller than or equal to the threshold voltage. Therefore, the transistor TR13 is switched on by the reference signal SREF3 (e.g., 2X Volts). In other words, the pull up unit 510 is enabled in the voltage mode within a period T2 as shown in FIG. 6.

Similarly, within the period T2, the transistor TR22 is switched on, such that the transistor TR19 is switched off by the voltage VSS, i.e., the pull down unit 520 is disabled. Therefore, the driver circuit 500 is operated to pull up a voltage level of the output signal SOUT in the voltage mode within the period T2.

As illustratively shown in FIG. 6, specifically, within the period T2, since the input signal SIN is still at a logic high level, the control signals SC7 and SC10 are still at a logic high level. Therefore, the transistor TR16 is switched off by the control signal SC7 (e.g., 3X Volts) and the transistor TR22 is switched on by the control signal SC10 (e.g., 1X Volts). In other words, the pull up unit 510 is enabled and the pull down unit 520 is disabled in this period.

Furthermore, within the period T2, the control circuit (not shown in the figure) outputs the control signals SC8 and SC9 at a logic high level. Therefore, the transistor TR17 is switched on and the transistor 18 is switched off. Accordingly, the control terminal of the transistor TR13 receives the reference signal SREF3. As a result, the transistor TR13 is operated in the voltage mode. Accordingly, the driver circuit 500 is operated to pull up a voltage level of the output signal SOUT in the voltage mode when the input signal SIN is at a logic high level and the first difference between a voltage level of the output signal SOUT and the voltage VDD is smaller than or equal to the threshold voltage.

Moreover, within the period T2, the voltage level of the output signal SOUT is high. Therefore, the control circuit (not shown in the figure) is configured to generate the control signal SC6 at a logic high level (e.g., 2X Volts) to prevent cross voltage of each of the transistors TR13-TR15 from overstress (e.g., exceeding 1X Volts).

In operation S750, the transistor TR24 is switched on and the transistors TR22 and TR23 are switched off when the input signal SIN is at a logic low level and a second difference between a voltage level of the output signal SOUT and the voltage VSS is greater than the threshold voltage. Therefore, the transistor TR19 is switched on and operated in a self-bias form. In other words, the pull down unit 520 is enabled in the current mode within a period T3 as shown in FIG. 6.

Moreover, within the period T3, the transistor TR16 is switched on, such that the transistor TR13 is switched off by the voltage VDD, i.e., the pull up unit 510 is disabled. Therefore, the driver circuit 500 is operated to pull down a voltage level of the output signal SOUT in the current mode within the period T3.

As illustratively shown in FIG. 6, specifically, the control signals SC7 and SC10 are corresponding to the input signal SIN. Thus, when the input signal SIN is at a logic low level, the transistor TR22 is switched off by the control signal SC10 (at a logic low level, e.g., 0 Volts). Accordingly, the transistor TR19 is switched on, i.e., the pull down unit 520 is enabled. Simultaneously, the transistor TR16 is switched on by the control signal SC7 (at a logic low level, e.g., 2X Volts). Accordingly, the transistor TR13 is switched off by the voltage VDD, i.e., the pull up unit 510 is disabled.

Furthermore, within the period T3, the control circuit (not shown in the figure) outputs the control signals SC11 and SC12 at a logic high level. Accordingly, the transistor TR24 is switched on and the transistor 23 is switched off (in the present embodiment, the transistor TR24 is an N-type MOS transistor and the transistor TR23 is an P-type MOS transistor). Therefore, the control terminal and the second terminal of the transistor TR19 are connected. As a result, the transistor TR19 is operated in a self-bias form. Accordingly, the driver circuit 500 is operated to pull down a voltage level of the output signal SOUT in the current mode when the input signal SIN is at a logic low level and the second difference between a voltage level of the output signal SOUT and the voltage VSS is greater than the threshold voltage.

Moreover, within the period T3, the voltage level of the output signal SOUT is high. Therefore, the control circuit (not shown in the figure) is configured to generate the control signal SC6 at a logic high level (e.g., 2X Volts) to prevent cross voltage of each of the transistors TR19-TR21 from overstress (e.g., exceeding 1X Volts).

In operation S770, the transistor TR23 is switched on and the transistors TR22 and TR24 are switched off when the input signal SIN is at a logic low level and the second difference is smaller than or equal to the threshold voltage. Therefore, the transistor TR19 is switched on by the reference signal SREF4. In other words, the pull down unit 520 is enabled in the voltage mode within a period T4 as shown in FIG. 6.

Similarly, within the period T4, the transistor TR16 is switched on, such that the transistor TR13 is switched off by the voltage VDD, i.e., the pull up unit 510 is disabled. Therefore, the driver circuit 500 is operated to pull down a voltage level of the output signal SOUT in the voltage mode within the period T4.

As illustratively shown in FIG. 6, specifically, within the period T4, since the input signal SIN is still at a logic low level, the control signals SC7 and SC10 are still at a logic low level. Therefore, the transistor TR22 is switched off by the control signal SC10 (e.g., 0 Volts) and the transistor TR16 is switched on by the control signal SC7 (e.g., 2X Volts). In other words, the pull down unit 520 is enabled and the pull up unit 510 is disabled in this period.

Furthermore, within the period T4, the control circuit (not shown in the figure) outputs the control signals SC11 and SC12 at a logic low level. Accordingly, the transistor TR23 is switched on and the transistor 24 is switched off. Therefore, the control terminal of the transistor TR19 receives the reference signal SREF4. As a result, the transistor TR19 is operated in the voltage mode. Accordingly, the driver circuit 500 is operated to pull down a voltage level of the output signal SOUT in the voltage mode when the input signal SIN is at a logic low level and the second difference between a voltage level of the output signal SOUT and the voltage VSS is smaller than or equal to the threshold voltage.

Moreover, within the period T4, the voltage level of the output signal SOUT is low. Therefore, the control circuit (not shown in the figure) is configured to generate the control signal SC6 at a logic low level (e.g., 1X Volts) to prevent cross voltage of each of the transistors TR19-TR21 from overstress (e.g., exceeding 1X Volts).

Accordingly, the driver circuit 500 is realized to be driven in the self-bias current mode or in the voltage mode selectively. In other words, SSO noise and HCI risk of the driver circuit 500 are reduced with large currents, and slew rate of the output signal SOUT can be controlled effectively. Moreover, the driver circuit 500 has good impedance linearity when operated in the voltage mode. Furthermore, the voltage mode driver and the current mode driver of the driver circuit 500 share the same hardware, such that the hardware area can be saved and the cost can be reduced.

In summary, the driver circuit of the present disclosure includes both the voltage mode driver and the current mode driver. Therefore, SSO noise and HCI risk of the driver circuit with large currents are reduced, and slew rate of the output signal is controlled effectively. Moreover, the driver circuit has good impedance linearity when operated in voltage mode. Furthermore, the self bias current mode driver is provided to substitute for the constant current mode driver, such that the cost of the driver circuit is reduced. In addition, the area of the driver circuit is saved by combining the voltage mode driver with the current mode driver in the same hardware.

In some embodiments, a device is disclosed that includes a driver circuit and a control circuit. The driver circuit is configured to provide an output signal according to an input signal, and operated with a first voltage and a second voltage. The driver circuit includes a pull up unit and a pull down unit configured to pull up and pull down a voltage level of the output signal, respectively. The control circuit is configured to selectively enable one of the pull up unit and the pull down unit according to the input signal, so as to adjust the voltage level of the output signal. The control circuit is further configured to drive the enabled one of the pull up unit and the pull down unit in a voltage mode or a current mode selectively according to the voltage level of the output signal, the first voltage and the second voltage.

Also disclosed is a device that includes a driver circuit and a control circuit. The driver circuit is configured to provide an output signal according to an input signal, and operated with a first voltage and a second voltage. The driver circuit includes a first pull up unit, a first pull down unit, a second pull up unit and a second pull down unit. The first pull up unit is configured to pull up a voltage level of the output signal in a voltage mode. The first pull down unit is configured to pull down a voltage level of the output signal in the voltage mode. The second pull up unit is configured to pull down a voltage level of the output signal in a current mode. The second pull down unit is configured to pull down a voltage level of the output signal in the current mode. The control circuit is configured to selectively enable one of the first pull up unit, the first pull down unit, the second pull up unit, the second pull down unit according to the input signal, the voltage level of the output signal, the first voltage and the second voltage, so as to adjust the voltage level of the output signal.

Also disclosed is a method that includes the steps outlined below. One of a first transistor and a second transistor in a driver circuit is switched on selectively, so as to adjust a voltage level of an output signal provided by the driver circuit according to an input signal, in which the driver circuit is operated with a first voltage and a second voltage. The switched-on one of the first transistor and the second transistor is driven in a voltage mode or a current mode selectively according to the voltage level of the output signal, the first voltage and the second voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a driver circuit configured to provide an output signal according to an input signal and operated with a first voltage and a second voltage, the driver circuit comprising:
      a pull up unit configured to pull up a voltage level of the output signal; and
      a pull down unit configured to pull down the voltage level of the output signal; and
   a control circuit configured to selectively enable one of the pull up unit and the pull down unit according to the input signal, so as to adjust the voltage level of the output signal, and configured to drive the enabled one of the pull up unit and the pull down unit in a voltage mode or a current mode selectively based on a comparison of the voltage level of the output signal with one of the first voltage and the second voltage.

2. The device of claim 1, wherein the control circuit is configured to enable the pull up unit to pull up the voltage level of the output signal when the input signal is at a logic high level, and configured to enable the pull down unit to pull down the voltage level of the output signal when the input signal is at a logic low level.

3. The device of claim 1, wherein the control circuit is configured to drive the enabled pull up unit in the current mode when a difference between the voltage level of the output signal and the first voltage is approximately greater than a threshold voltage, and configured to drive the enabled pull up unit in the voltage mode when the difference is approximately smaller than or equal to the threshold voltage.

4. The device of claim 1, wherein the control circuit is configured to drive the enabled pull down unit in the current mode when a difference between the voltage level of the output signal and the second voltage is approximately greater than a threshold voltage, and configured to drive the enabled pull down unit in the voltage mode when the difference is approximately smaller than or equal to the threshold voltage.

5. The device of claim 1, wherein the pull up unit comprises a first transistor, and the pull down unit comprises a second transistor, wherein when the input signal is at a logic high level, the control circuit is configured to switch on the first transistor and switch off the second transistor to enable the pull up unit, and when the input signal is at a logic low level, the control circuit is configured to switch on the second transistor and switch off the first transistor to enable the pull down unit.

6. The device of claim 5, wherein the pull up unit further comprises a third transistor electrically coupled to the first transistor, and the pull down unit further comprises a fourth transistor electrically coupled to the second transistor, wherein when the input signal is at the logic low level, the control circuit is configured to switch on the third transistor according to the input signal, so as to switch off the first transistor, when the input signal is at the logic high level, the control circuit is configured to switch on the fourth transistor according to the input signal, so as to switch off the second transistor.

7. The device of claim 5, wherein the pull up unit further comprises:
   a third transistor comprising:
      a first terminal configured to receive the first voltage;
      a second terminal electrically coupled to a control terminal of the first transistor; and
      a control terminal configured to receive a first control signal corresponding to the input signal;

wherein the pull down unit further comprises:
a fourth transistor comprising:
  a first terminal configured to receive the second voltage;
  a second terminal electrically coupled to a control terminal of the second transistor; and
  a control terminal configured to receive a second control signal corresponding to the input signal.

8. The device of claim 5, wherein the pull up unit further comprises a third transistor electrically coupled to the first transistor, wherein the control circuit is configured to drive the enabled pull up unit in the current mode by switching on the third transistor to connect a control terminal and a first terminal of the first transistor, and configured to drive the enabled pull up unit in the voltage mode by switching off the third transistor and providing a reference signal to the control terminal of the first transistor.

9. The device of claim 5, wherein the pull down unit further comprises a third transistor electrically coupled to the second transistor, wherein the control circuit is configured to drive the enabled pull down unit in the current mode by switching on the third transistor to connect a control terminal and a first terminal of the second transistor, and configured to drive the enabled pull down unit in the voltage mode by switching off the third transistor and providing a reference signal to the control terminal of the second transistor.

10. The device of claim 5, wherein the pull up unit further comprises:
a third transistor comprising:
  a first terminal configured to receive a first reference signal; and
  a second terminal electrically coupled to a control terminal of the first transistor;
a fourth transistor comprising:
  a first terminal electrically coupled to the control terminal of the first transistor; and
  a second terminal electrically coupled to a first terminal of the first transistor;
wherein the pull down unit further comprises:
a fifth transistor comprising:
  a first terminal configured to receive a second reference signal; and
  a second terminal electrically coupled to a control terminal of the second transistor; and
a sixth transistor comprising:
  a first terminal electrically coupled to the control terminal of the second transistor; and
  a second terminal electrically coupled to a first terminal of the second transistor.

11. A device comprising:
a driver circuit configured to provide an output signal according to an input signal and operated with a first voltage and a second voltage, the driver circuit comprising:
  a first pull up unit configured to pull up a voltage level of the output signal in a voltage mode;
  a first pull down unit configured to pull down the voltage level of the output signal in the voltage mode;
  a second pull up unit configured to pull up the voltage level of the output signal in a current mode; and
  a second pull down unit configured to pull down the voltage level of the output signal in the current mode; and
a control circuit configured to selectively enable one of the first pull up unit, the first pull down unit, the second pull up unit and the second pull down unit according to the input signal, based on a comparison of the voltage level of the output signal with one of the first voltage and the second voltage, so as to adjust the voltage level of the output signal.

12. The device of claim 11, wherein the control circuit is configured to enable the first pull up unit when the input signal is at a logic high level and a difference between the voltage level of the output signal and the first voltage is approximately smaller than or equal to a threshold voltage.

13. The device of claim 12, wherein the control circuit is configured to enable the second pull up unit when the input signal is at the logic high level and the difference is approximately greater than the threshold voltage.

14. The device of claim 11, wherein the control circuit is configured to enable the first pull down unit when the input signal is at a logic low level and a difference between the voltage level of the output signal and the second voltage is approximately smaller than or equal to a threshold voltage.

15. The device of claim 14, wherein the control circuit is configured to enable the second pull down unit when the input signal is at the logic low level and the difference is approximately greater than the threshold voltage.

16. The device of claim 11, wherein the second pull up unit comprises a first current mirror configured to provide a first current, and the second pull down unit comprises a second current mirror configured to provide a second current.

17. The device of claim 11, wherein the second pull up unit comprises a transistor, a first terminal of the transistor configured to receive the first voltage, wherein when the second pull up unit is enabled, a control terminal and a second terminal of the transistor are connected.

18. The device of claim 11, wherein the second pull down unit comprises a transistor, a first terminal of the transistor configured to receive the second voltage, wherein when the second pull down unit is enabled, a control terminal and a second terminal of the transistor are connected.

19. A method comprising:
  selectively switching on one of a first transistor and a second transistor in a driver circuit to adjust a voltage level of an output signal, wherein the driver circuit is configured to provide the output signal according to an input signal and configured to be operated with a first voltage and a second voltage; and
  driving the switched-on one of the first transistor and the second transistor in a voltage mode or a current mode selectively based on a comparison of the voltage level of the output signal with one of the first voltage and the second voltage.

20. The method of claim 19, wherein selectively switching on the one of the first transistor and the second transistor comprises:
  switching on the first transistor to pull up the voltage level of the output signal when the input signal is at a logic high level; and
  switching on the second transistor to pull down the voltage level of the output signal when the input signal is at a logic low level.

21. The method of claim 19, wherein driving the switched-on one of the first transistor and the second transistor in the voltage mode or the current mode selectively comprises:
  driving the switched-on first transistor in the current mode when a first difference between the voltage level of the output signal and the first voltage is approximately greater than a threshold voltage;

driving the switched-on first transistor in the voltage mode when the first difference is approximately smaller than or equal to the threshold voltage;

driving the switched-on second transistor in the current mode when a second difference between the voltage level of the output signal and the second voltage is approximately greater than the threshold voltage; and driving the switched-on second transistor in the voltage mode when the second difference is approximately smaller than or equal to the threshold voltage.

\* \* \* \* \*